United States Patent
Tramoni et al.

(10) Patent No.: US 11,838,024 B2
(45) Date of Patent: Dec. 5, 2023

(54) CIRCUIT AND METHOD FOR CYCLIC ACTIVATION OF AN ELECTRONIC FUNCTION

(71) Applicant: STMicroelectronics (Rousset) SAS, Rousset (FR)

(72) Inventors: Alexandre Tramoni, Le Beausset (FR); Jimmy Fort, Puyloubier (FR)

(73) Assignee: STMicroelectronics (Rousset) SAS, Rousset (FR)

(*) Notice: Subject to any disclaimer, the term of this patent is extended or adjusted under 35 U.S.C. 154(b) by 494 days.

(21) Appl. No.: 17/119,865

(22) Filed: Dec. 11, 2020

(65) Prior Publication Data

US 2021/0099162 A1 Apr. 1, 2021

Related U.S. Application Data

(63) Continuation-in-part of application No. PCT/FR2019/051553, filed on Jun. 25, 2019.

(30) Foreign Application Priority Data

Jun. 26, 2018 (FR) ..................................... 1855722

(51) Int. Cl.
| | | |
|---|---|---|
| *H03K 3/0233* | (2006.01) | |
| *G06F 1/3287* | (2019.01) | |
| *H03K 17/687* | (2006.01) | |

(52) U.S. Cl.
CPC ....... *H03K 3/02337* (2013.01); *G06F 1/3287* (2013.01); *H03K 17/687* (2013.01)

(58) Field of Classification Search
CPC ............. H03K 3/02337; H03K 17/687; G06F 1/3287; G06F 1/26; Y02D 10/00; Y02D 30/50
See application file for complete search history.

(56) References Cited

U.S. PATENT DOCUMENTS

| | | | | |
|---|---|---|---|---|
| 5,668,508 A | * | 9/1997 | Pulvirenti | H03K 3/011 331/111 |
| 5,818,207 A | * | 10/1998 | Hwang | H02M 3/1588 323/288 |
| 5,914,591 A | * | 6/1999 | Yasuda | H02M 3/1582 323/224 |
| 6,147,478 A | * | 11/2000 | Skelton | H02M 3/1588 323/284 |
| 6,163,190 A | * | 12/2000 | Takai | H03K 3/02337 327/131 |
| 6,922,044 B2 | | 7/2005 | Walters et al. | |
| 7,615,974 B1 | * | 11/2009 | Xu | H05B 45/3725 323/225 |
| 7,834,608 B2 | | 11/2010 | Cheng et al. | |
| 9,716,435 B2 | | 7/2017 | Radhakrishnan et al. | |
| 9,929,651 B2 | | 3/2018 | Cannankurichi et al. | |
| 9,935,618 B1 | * | 4/2018 | Fenigstein | H03K 3/3565 |

(Continued)

FOREIGN PATENT DOCUMENTS

| | | |
|---|---|---|
| CN | 102097934 A | 6/2011 |
| JP | H05157626 | 6/1993 |
| JP | 2003188693 A | 7/2003 |

*Primary Examiner* — Yusef A Ahmed
(74) *Attorney, Agent, or Firm* — Slater Matsil, LLP

(57) ABSTRACT

An embodiment provides a circuit of cyclic activation of an electronic function including a hysteresis comparator controlling the charge of a capacitive element powering the function.

24 Claims, 2 Drawing Sheets

(56) References Cited

U.S. PATENT DOCUMENTS

| | | | |
|---|---|---|---|
| 11,264,897 B2* | 3/2022 | Wiktor | H03K 7/08 |
| 2004/0120395 A1* | 6/2004 | Orr | H02M 3/157 |
| | | | 375/237 |
| 2005/0052168 A1* | 3/2005 | Tazawa | H02M 3/1584 |
| | | | 323/282 |
| 2005/0146311 A1* | 7/2005 | Kuo | H02M 1/38 |
| | | | 323/282 |
| 2008/0055808 A1* | 3/2008 | Burkland | H02H 3/087 |
| | | | 361/94 |
| 2008/0217076 A1* | 9/2008 | Kraemer | H04L 5/1423 |
| | | | 178/63 B |
| 2008/0298099 A1* | 12/2008 | Huang | H02M 1/32 |
| | | | 363/50 |
| 2009/0102408 A1* | 4/2009 | De Jesus | B62M 6/45 |
| | | | 318/484 |
| 2009/0252068 A1* | 10/2009 | Charles | H04L 5/1423 |
| | | | 370/276 |
| 2011/0026279 A1* | 2/2011 | Li | H02M 3/3376 |
| | | | 363/25 |
| 2012/0001603 A1* | 1/2012 | Ouyang | H02M 3/1588 |
| | | | 323/271 |
| 2012/0081084 A1* | 4/2012 | Yang | H02M 3/33507 |
| | | | 323/235 |
| 2012/0300499 A1* | 11/2012 | Chang | H03K 3/84 |
| | | | 363/16 |
| 2013/0093405 A1* | 4/2013 | De Cremoux | G05F 1/10 |
| | | | 323/282 |
| 2013/0106385 A1* | 5/2013 | Smith, Jr. | H02M 3/1588 |
| | | | 323/288 |
| 2013/0250215 A1* | 9/2013 | Sasaki | H05B 45/327 |
| | | | 349/69 |
| 2013/0257408 A1* | 10/2013 | Nakamoto | H02M 3/1582 |
| | | | 323/311 |
| 2014/0070780 A1* | 3/2014 | Yanagida | H02M 3/1588 |
| | | | 323/271 |
| 2014/0159695 A1* | 6/2014 | Jin | H02M 3/156 |
| | | | 323/288 |
| 2015/0002113 A1* | 1/2015 | Miyazaki | H02M 3/156 |
| | | | 323/284 |
| 2016/0036327 A1* | 2/2016 | Nam | H02M 3/156 |
| | | | 323/271 |
| 2017/0141685 A1* | 5/2017 | Cannankurichi | H02M 3/1563 |
| 2020/0003720 A1* | 1/2020 | Steffan | G01N 27/49 |
| 2020/0186133 A1* | 6/2020 | Billiot | H03K 5/13 |
| 2021/0175748 A1* | 6/2021 | Moffatt | H02M 3/33576 |
| 2022/0197324 A1* | 6/2022 | Hung | G05F 3/24 |

* cited by examiner

CIRCUIT AND METHOD FOR CYCLIC ACTIVATION OF AN ELECTRONIC FUNCTION

CROSS-REFERENCE TO RELATED APPLICATIONS

This application is a continuation-in-part of PCT Application No. FR2019051553, filed Jun. 25, 2019, which claims priority to French Application No. 1855722, filed on Jun. 26, 2018, all of which applications are hereby incorporated herein by reference.

TECHNICAL FIELD

The present disclosure generally relates to electronic circuits and methods, and, more specifically, to circuits and methods for selective activation of hardware functions. The present disclosure particularly applies to functions (blocks, cells, circuits, circuit portions, etc.) capable of being cyclically activated.

BACKGROUND

For power consumption reasons, certain electronic circuits comprise hardware functions capable of being selectively activated, so that their power supply can be cut off when they are not used. Some of these functions are cyclically (periodically) activated to simplify the control and to decrease their power consumption, or because this is imposed by the application.

These may be test functions, periodic calculation functions, etc.

JP2003-188693 describes an oscillating circuit used for a PWM command. The circuit uses a two-threshold comparator, combined with a capacitor, to generate a ramp and control the duty cycle of the PWM control signal.

US2016/036327 describes a buck converter using a variable pulse, including a switching unit to convert a power voltage provided by an external device into an internal voltage, and a pulse controller configured to variably control a control time of the switch unit based on a result obtained by detecting a difference between the power voltage and an output voltage which is the internal voltage.

CN102097934 describes a Hysteresis DC/DC buck converter.

SUMMARY

An embodiment overcomes all or part of the disadvantages of known circuits of periodic activation of electronic functions.

An embodiment provides a circuit of cyclic activation of an electronic function comprising a hysteresis comparator controlling the charge of a capacitive element powering the function.

According to an embodiment, the function is at least partially digital.

According to an embodiment, the function is at least partially analog.

According to an embodiment, the capacitive element constitutes a tank of energy intended to power the function.

According to an embodiment, the comparator regulates the consumption of the function.

According to an embodiment, the function is activated according to the result of the comparison provided by the comparator.

According to an embodiment, the circuit comprises a source of a constant current for charging the capacitor.

According to an embodiment, a switch is interposed between the current source and the capacitive element.

According to an embodiment, the comparator is powered with a voltage different from the voltage of the capacitive element.

An embodiment provides a method of cyclic activation of an electronic function comprising the steps of generating a voltage ramp; and activating, respectively deactivating, the function on each change of direction of the ramp, the function being powered by a capacitive element.

According to an embodiment, the ramp is generated by the charge and the discharge of the capacitive element.

An embodiment provides a circuit comprising at least one electronic function; and at least one activation circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Figure 1:
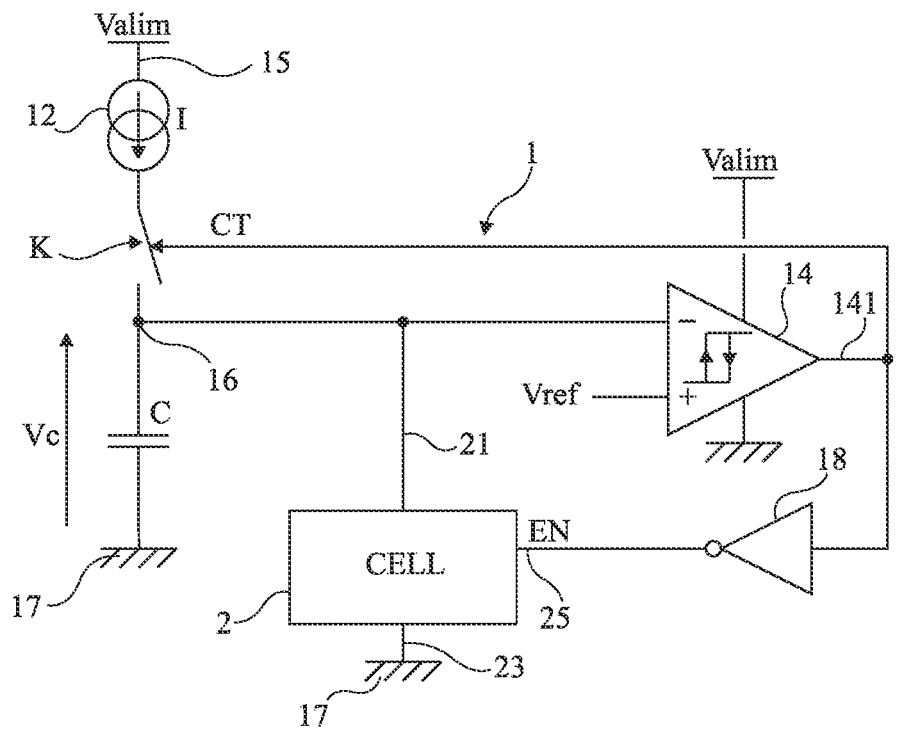
FIG. 1 schematically shows in the form of blocks an embodiment of cyclic activation circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the function capable of being activated, implemented by a hardware element, block, cell, or circuit, has not been detailed, the described embodiments being compatible with any usual function capable of being cyclically activated.

Unless otherwise stated, when reference is made to two elements connected to each other, it means directly connected without intermediate elements other than conductors, and when reference is made to two element coupled to each other, it means that these two elements can be connected or connected or coupled via one or more other elements.

The terms "about", "substantially", and "approximately" are used herein to designate a tolerance of plus or minus 10%, preferably of plus or minus 5%, of the value in question.

Generally, a circuit to be cyclically activated receives an activation signal originating from a state machine associated with a clock. The function of the state machine (for example, a counter) is to count a determined number of clock cycles to periodically activate the controlled circuit with a given duty cycle. However, the circuit generating the clock frequency and the state machine should be permanently powered to play their role. The power consumption then generated may be non-negligible. Further, the cyclically activated function is generally permanently powered with the same power supply voltage as that of the state machine which activates it.

According to the described embodiments, it is provided to power the function capable of being selectively activated from a periodic power supply signal. Further, it is provided to generate the periodic activation signal from the periodic power supply signal. Thus, it is preferably provided to modify not only the way in which the function activation signal is generated, but also the way in which the function is powered.

Thus, unlike circuits controlling the duty cycle of a function such as an oscillator, it is provided to change the powering duty cycle of the function itself.

In applications targeted by the present disclosure, a function capable of being cyclically activated of an electronic circuit is a portion of this circuit, called block, cell, or function, capable of being selectively powered with respect to other portions of the electronic circuit. Such a portion of circuit is, preferably, a digital and/or analog function of several active components, for example logic gates, as opposed to passive components, such as resistances, capacitors, inductors. Preferably, the function is not limited to a simple switch but is a more complex function than a simple switch.

FIG. 1 schematically shows in the form of blocks an embodiment of a circuit 1 of cyclic activation of a hardware electronic function 2.

Hardware function 2 is symbolized by a block or cell 2 (CELL) and may be any function compatible with a cyclic activation. Cell 2 comprises two power supply terminals 21 and 23 and one activation terminal 25. Cell 2 comprises other terminals, particularly input/output terminals, not shown, which depend on the application.

Activation circuit 1 is based on the generation of a voltage ramp, made periodic by the alternation of cycles of charge and discharge of a capacitive element C, for example, a capacitor. Capacitor C is coupled, by a switch K controllable in all or nothing, to a source 12 of a current I, preferably constant. Thus, source 12, switch K, and capacitor C are series-connected between terminals 15 and 17 of application of a power supply voltage Valim, terminal 17 defining a reference potential, typically the ground. Voltage Valim is a power supply voltage extracted from the power supply of the electronic circuit integrating function 2 and its activation circuit 1, or the power supply voltage of this circuit.

Switch K is controlled by a signal CT supplied by a hysteresis comparator 14 of voltage Vc across capacitor C with a reference voltage Vref. Thus, node 16 between switch K and capacitor C is coupled, preferably connected, to an input of comparator 14, the other input of comparator 14 receiving voltage Vref. The hysteresis of comparator 14 is defined by two thresholds THH and THL, respectively greater and smaller than voltage Vref and conditioning the switching of output 141 of comparator 14. In the shown example, it is assumed that voltage Vref is applied to the positive input (+) of comparator 14 while voltage Vc is applied to its negative input (−). In this case, the output of comparator 14 switches to a low state as long as increasing voltage Vc reaches threshold THH and switches to a high state as soon as decreasing voltage Vc reaches threshold THL.

Output 141 is coupled, preferably connected, to a control terminal of switch K (for example, the gate of a MOS transistor forming switch K). Terminal 141 is further coupled, in the shown example, to terminal 25 of activation of cell 2 via an inverter 18. Inverter 18 supplies a signal EN for activating the cell, arbitrarily assumed to be active in the high state. The inverse is possible according to the structure of cell 2. For example, for an activation in the low state of cell 2, inverter 18 is omitted.

Comparator 14 (and inverter 18 if present) is powered with voltage Valim.

To combine a power supply and an activation of cell 2, cell 2 is powered by voltage Vc across capacitor C. Thus, its terminal 21 is coupled, preferably connected, to node 16 and its terminal 23 is coupled, preferably connected, to terminal 17.

Figure 2:
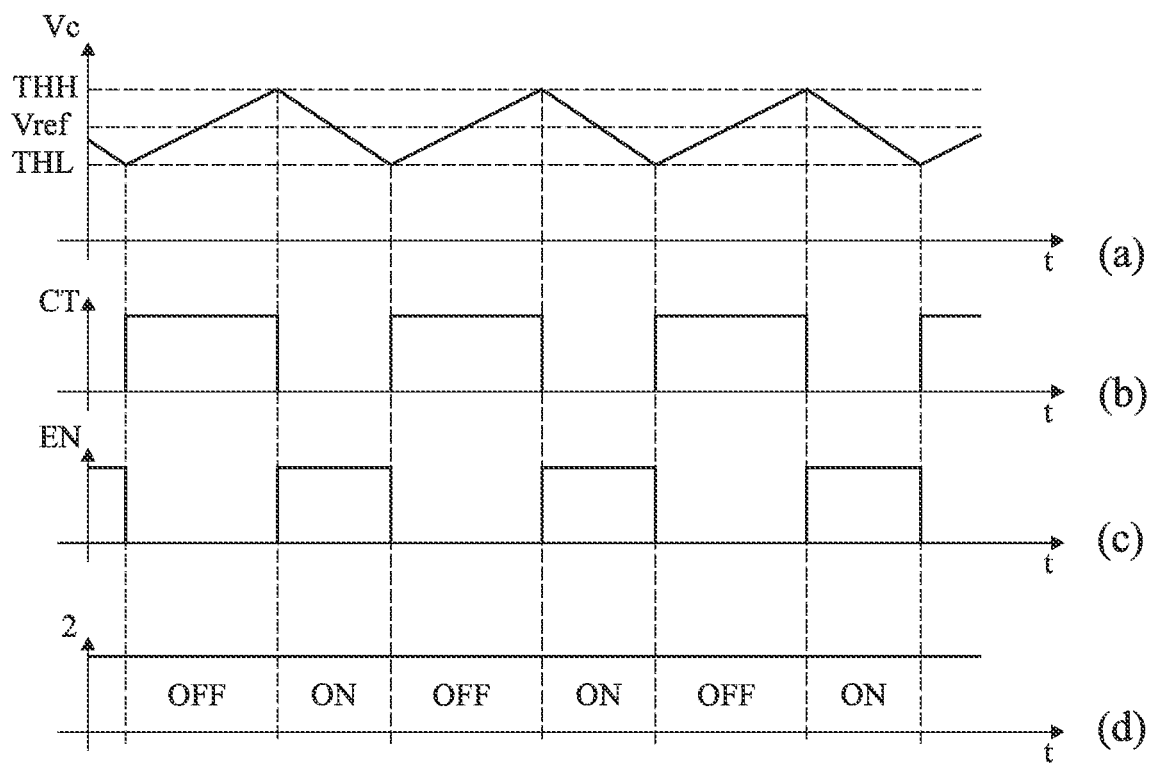
FIG. 2 illustrates, in the form of timing diagrams, the operation of the circuit of FIG. 1.

FIG. 2 illustrates, in timing diagrams (a), (b), (c), and (d), the operation of the circuit of FIG. 1.

Timing diagrams (a), (b), (c), and (d) respectively illustrate examples of the shapes of voltage Vc present on node 16, of signal CT for controlling the turning-on of switch K, of signal EN of activation of cell 2, and of the active (ON) and inactive (OFF) states of cell 2.

Due to hysteresis comparator 14 and to the power supply of cell 2 by capacitor C, the operation is cyclic. In other words, voltage Vc alternates increasing ramps when switch K is on (current source 12 then charging capacitor C) and decreasing ramps when switch K is off (capacitor C discharging in order to power function 2). In other words, the powering duty cycle of the activated function is changed. The more the function or cell consumes, the faster the capacitor C discharges and the less the cell is active in time. The average consumption is constant but the duty cycle is modified to activate the cell during a time more or less long.

As shown in FIG. 1, the hysteresis comparator preferably performs two actions. It controls the activation of the digital function (EN signal) and it controls the charge of the capacitor C to power this function (signal CT).

The inversion of the output signal of comparator 14 to activate function 2 enables to avoid for the function to permanently consume power. Although there may remain leakage currents, these are lower than those which would exist if function 2 was permanently powered (with voltage Valim).

The duration of the on or off periods of function 2 depends on the hysteresis of the comparator and on the capacitance of capacitor C.

The duration of the off periods of function 2 depends on the intensity of current I and on the capacitance of capacitor C.

As a specific embodiment, one may form a current source 12 of VBG/R type in a MOS technology, that is, which is a function of the bandgap voltage, or of Vbe/R type in a bipolar technology. Voltage Vref is for example, in MOS technology, the bandgap voltage. More generally, it is desired to have a temperature-stable voltage and any voltage of this type is appropriate.

An advantage of the described embodiments is that the power consumption is considerably decreased outside of activation periods. Current source 12, comparator 14, and inverter 18 are the only elements needing to be permanently powered with voltage Valim. For the rest, capacitor C stores power which is delivered back and which is thus not lost.

Another advantage is that the provided solution is less bulky within the circuit. Comparator 14 and optional inverter 18 are the only two elements which need to be internal to circuit 1 and are much less bulky than a state machine. According to the application, capacitor C is or not integrated to the circuit. It may thus be located outside of the electronic circuit integrating cell 2 and activation circuit 1, which enables to further decrease the size of the integrated circuit supporting the function capable of being cyclically activated.

Figure 3:
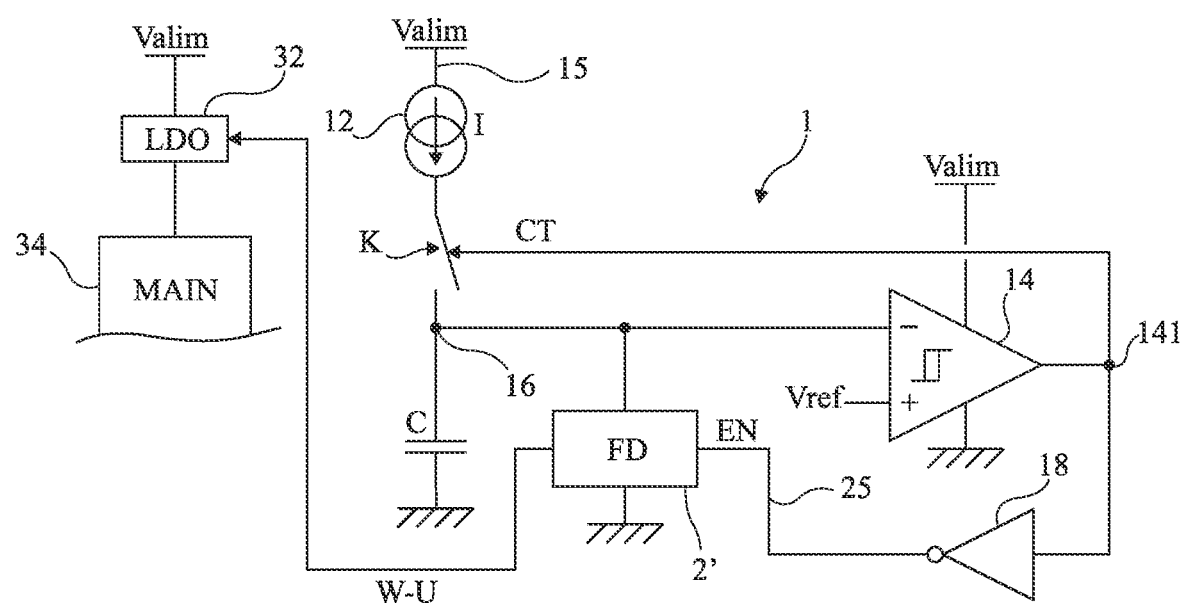
FIG. 3 schematically shows in the form of blocks an embodiment of an electronic device.

FIG. 3 schematically shows in the form of blocks an embodiment of an electronic device 3 integrating a circuit 1 of cyclic activation of a hardware electronic function or cell 2'.

Circuit 1 is identical to circuit 1 described in relation with FIG. 1 and comprises the same elements, which will not be detailed again. In the embodiment of FIG. 3, cell 2' (FD), which is cyclically activated by circuit 1 is a function aiming to trigger other circuits of the device 3. For example, cell 2' provides a control signal W-U activating a power supply circuit 32 (for example a Low Dropout Regulator—LDO), powered by voltage Valim and powering one or several circuits 34 (MAIN) of device 3. Signal W-U is for example a Wake-Up signal triggered by cell 2'. Once activated, circuits 32 and 34 remain active and powered as long as voltage Valim is present or until activation of a stand-by mode.

As an exemplary embodiment, device 3 is a near field communication (NFC) device or comprises NFC functions. Voltage Valim is a voltage provided by a Radio Frequency or electromagnetic field generated by another device in the field of which device 3 is located. In such an embodiment, cell 2' is a Field Detector, which generates the Wake-Up signal when a field is detected.

A same NFC device can operate in card mode or in reader mode (for example, in the case of a near field communication between two mobile phones). The devices are then powered by batteries. The battery of an NFC device can then be recharged by means of near field or via a charger powered by mains power.

In such an application, a Field Detector of an NFC device operating in card mode is periodically activated in order to check whether a field is present. This usually requires the activation of a power supply circuit such as the LDO 32 powered by the battery and that functions of the mains processor are kept active in order to trigger the Field Detector 2'. In the disclosed embodiment, we take advantage of circuit 1 to periodically enable the operation of field detector 2' without needing to keep LDO 32 and circuit 34 active. The periodicity of the activation of the field detector 2' depends on the capacitance of capacitor C. In a particular embodiment, the NFC device respects the requirements set by the NFC Forum and the capacitance of capacitor C is chosen in order to respect this periodicity.

An advantage is that it further reduces the consumption of an NFC device operating in card mode.

Various embodiments and variations have been described. It will be understood by those skilled in the art that certain characteristics of these various embodiments and variations may be combined, and other variations will occur to those skilled in the art. In particular, the selection of the values to be given to the different components and voltages depends on the application.

Finally, the practical implementation of the described embodiments and variations is within the abilities of those skilled in the art based on the functional indications given hereinabove, particularly regarding the forming of current source 12 and of the different elements according to the components available in the application.

What is claimed is:

1. A near field communication (NFC) device, comprising:
   a capacitive element configured to power a field detector;
   a hysteresis comparator configured to:
      control a charge of the capacitive element; and
      alternatingly activate and deactivate the field detector according to a comparison output of the hysteresis comparator;
   the field detector, configured to send a wake-up signal to a power supply circuit, in response to detecting an NFC electromagnetic field;
   the power supply circuit, configured to power an NFC function circuit in response to receiving the wake-up signal from the field detector; and
   the NFC function circuit, configured to communicate using NFC.

2. The NFC device of claim 1, wherein the field detector is at least partially digital.

3. The NFC device of claim 1, wherein the field detector is at least partially analog.

4. The NFC device of claim 1, wherein the capacitive element comprises a tank of energy configured to power the field detector.

5. The NFC device of claim 1, wherein the hysteresis comparator is configured to regulate power consumption of the field detector.

6. The circuit NFC device of claim 1, wherein the hysteresis comparator is configured to generate the comparison output by comparing the charge of the capacitive element with a reference voltage.

7. The NFC device of claim 1, further comprising a constant current source configured to charge the capacitive element.

8. The NFC device of claim 7, further comprising a switch interposed between the constant current source and the capacitive element.

9. The NFC device of claim 1, wherein the hysteresis comparator is powered by a first voltage different from a second voltage of the capacitive element.

10. A method for enabling near field communication (NFC), the method comprising:
    generating, by a capacitive element, a periodic voltage ramp;
    powering, by the capacitive element, a field detector;
    alternatingly activating and deactivating, by a hysteresis comparator, the field detector on each change of direction of the periodic voltage ramp;
    generating, by the field detector, a wake-up signal in response to detecting an NFC electromagnetic field;
    powering, by a power supply circuit, an NFC function circuit in response to receiving the wake-up signal; and
    communicating, by the NFC function circuit, using NFC.

11. The method of claim 10, further comprising charging and discharging the capacitive element to generate the periodic voltage ramp.

12. The method of claim 10, further comprising powering the field detector with a tank of energy in the capacitive element.

13. The method of claim 10, further comprising regulating, by the hysteresis comparator, a power consumption of the field detector.

14. The method of claim 10, further comprising powering the hysteresis comparator with a first voltage different from a second voltage of the capacitive element.

15. The method of claim 10, further comprising alternatingly activating and deactivating the field detector according to a comparison of the periodic voltage ramp with a reference voltage by the hysteresis comparator.

16. The method of claim 10, wherein the alternatingly activating and deactivating comprises alternatingly activating and deactivating, respectively, a switch interposed between the capacitive element and a constant current source.

17. A first near field communication (NFC) device, comprising:
   a constant current source powerable by a first voltage provided by an NFC electromagnetic field generated by a second NFC device;
   a switch having conduction terminals coupled between the constant current source and a first node;
   a capacitive element coupled between the first node and a ground;
   a hysteresis comparator comprising:
      a first input coupled to the first node;
      a second input coupled to a reference voltage; and
      a comparator output coupled to a control terminal of the switch;
   a field detector having a first power input coupled to the first node, an enable input coupled to the comparator output of the hysteresis comparator, and a wake-up output coupled to a power supply circuit;
   the power supply circuit having an activation input coupled to the wake-up output of the field detector; and
   an NFC function circuit having a second power input coupled to the power supply circuit.

18. The first NFC device of claim 17, wherein the hysteresis comparator and the power supply circuit are powerable by the first voltage provided by the NFC electromagnetic field generated by the second NFC device.

19. The first NFC device of claim 17, wherein only the constant current source, the hysteresis comparator, and the power supply circuit of the first NFC device are permanently powered in a presence of the NFC electromagnetic field generated by the second NFC device.

20. The first NFC device of claim 17, further comprising an inverter coupled between the comparator output and the enable input of the field detector.

21. The first NFC device of claim 17, wherein the power supply circuit is a low dropout regulator.

22. The first NFC device of claim 17, wherein the constant current source, the switch, the hysteresis comparator, and the field detector are disposed on an integrated circuit, and the capacitive element is disposed external to the integrated circuit.

23. A method for enabling near field communication (NFC) by an NFC device, the method comprising:
   controlling, by a hysteresis comparator, a charge of a capacitive element;
   powering, by the capacitive element, a field detector;
   comparing, by the hysteresis comparator, a first voltage of the capacitor with a reference voltage;
   alternatingly activating and deactivating, by the hysteresis comparator, the field detector according to a result of the comparing;
   generating, by the field detector, a wake-up signal in response to detecting an NFC electromagnetic field;
   powering, by a power supply circuit, an NFC function circuit in response to receiving the wake-up signal; and
   communicating, by the NFC function circuit, using NFC.

24. The method of claim 23, further comprising operating, by the NFC device, in a card mode.

* * * * *

UNITED STATES PATENT AND TRADEMARK OFFICE
CERTIFICATE OF CORRECTION

| | |
|---|---|
| PATENT NO. | : 11,838,024 B2 |
| APPLICATION NO. | : 17/119865 |
| DATED | : December 5, 2023 |
| INVENTOR(S) | : Tramoni et al. |

It is certified that error appears in the above-identified patent and that said Letters Patent is hereby corrected as shown below:

In the Claims

In Column 6, in Claim 6, Line 28, delete "circuit NFC" and insert -- NFC --.

Signed and Sealed this
Twenty-seventh Day of February, 2024

Katherine Kelly Vidal
*Director of the United States Patent and Trademark Office*